United States Patent
Xu et al.

(10) Patent No.: US 12,206,418 B2
(45) Date of Patent: Jan. 21, 2025

(54) DELAY DEVICE AND DELAY CONTROL METHOD

(71) Applicant: Montage Technology (Kunshan) Co., Ltd., Suzhou (CN)

(72) Inventors: Wenlin Xu, Suzhou (CN); Lixin Jiang, Suzhou (CN); Bo Qu, Suzhou (CN); Jinfu Chen, Suzhou (CN)

(73) Assignee: Montage Technology (Kunshan) Co., Ltd., Suzhou (CN)

( * ) Notice: Subject to any disclaimer, the term of this patent is extended or adjusted under 35 U.S.C. 154(b) by 0 days.

(21) Appl. No.: 18/037,776

(22) PCT Filed: May 27, 2022

(86) PCT No.: PCT/CN2022/095734
§ 371 (c)(1),
(2) Date: May 19, 2023

(87) PCT Pub. No.: WO2023/273748
PCT Pub. Date: Jan. 5, 2023

(65) Prior Publication Data
US 2023/0412159 A1    Dec. 21, 2023

(30) Foreign Application Priority Data
Jun. 29, 2021  (CN) .......................... 202110726706.6

(51) Int. Cl.
*H03K 5/133* (2014.01)
*H03K 19/17784* (2020.01)
*H03K 5/00* (2006.01)

(52) U.S. Cl.
CPC ....... *H03K 5/133* (2013.01); *H03K 19/17784* (2013.01); *H03K 2005/00065* (2013.01); *H03K 2005/00084* (2013.01)

(58) Field of Classification Search
CPC ............. H03K 5/133; H03K 19/17784; H03K 2005/00065; H03K 2005/00084
(Continued)

(56) References Cited

U.S. PATENT DOCUMENTS 6,242,954 B1 * 6/2001 Taniguchi ............. H03L 7/0818
327/158
6,426,900 B1 * 7/2002 Maruyama ............. G11C 7/222
365/194

(Continued)

FOREIGN PATENT DOCUMENTS

| CN | 1846355 | 10/2006 |
|---|---|---|
| CN | 101711457 | 5/2010 |
| CN | 101789774 | 7/2010 |

OTHER PUBLICATIONS

"International Search Report (Form PCT/ISA/210) of PCT/CN2022/095734," mailed on May 27, 2022, pp. 1-4.
(Continued)

*Primary Examiner* — Ryan Jager
(74) *Attorney, Agent, or Firm* — JCIPRNET

(57) ABSTRACT

A delay device and a delay control method are provided. The delay device includes at least one current-controlled delay group and at least one switch. The at least one current-controlled delay group is coupled to a transmission wire, each of the at least one current-controlled delay group includes at least one current-controlled delayer, and each of the at least one current-controlled delayer provides a delay according to a control voltage. The at least one switch is coupled between the at least one current-controlled delay group and the transmission wire, and each of the at least one switch is turned on or off according to a bit of an enable signal applied thereto. In the disclosure, the generated delay can be dynamically adjusted and cannot be affected by parasitic capacitance.

16 Claims, 7 Drawing Sheets

(58) Field of Classification Search
USPC .......................................................... 327/276
See application file for complete search history.

(56) References Cited

U.S. PATENT DOCUMENTS

| | | | | |
|---|---|---|---|---|
| 6,452,430 | B1 * | 9/2002 | Tung | H03L 7/0995 |
| | | | | 327/158 |
| 6,549,052 | B2 * | 4/2003 | Okayasu | H03K 5/133 |
| | | | | 327/276 |
| 6,621,315 | B2 * | 9/2003 | Heo | H03L 7/089 |
| | | | | 327/158 |
| 7,202,721 | B2 * | 4/2007 | Jeon | H03L 7/0816 |
| | | | | 327/158 |
| 7,319,349 | B2 * | 1/2008 | Tomita | G06F 1/12 |
| | | | | 327/144 |
| 7,525,364 | B2 * | 4/2009 | Ariyoshi | H03L 7/0805 |
| | | | | 327/155 |
| 7,622,968 | B2 * | 11/2009 | Liu | H03L 7/0818 |
| | | | | 327/158 |
| 11,451,219 | B2 * | 9/2022 | Shang | H03K 5/00 |
| 11,533,048 | B1 * | 12/2022 | Wu | H03K 5/133 |
| 2009/0160520 | A1 | 6/2009 | Matsunami | |
| 2011/0156785 | A1 * | 6/2011 | Bettini | H03L 7/0818 |
| | | | | 327/161 |
| 2013/0176062 | A1 * | 7/2013 | Wang | H03K 5/133 |
| | | | | 327/161 |
| 2014/0021557 | A1 * | 1/2014 | Priel | H01L 27/0928 |
| | | | | 257/369 |
| 2019/0190505 | A1 * | 6/2019 | Yi | H03K 5/14 |
| 2022/0094344 | A1 * | 3/2022 | Shang | H03K 5/13 |
| 2023/0412159 | A1 * | 12/2023 | Xu | H03K 19/17784 |
| 2024/0072843 | A1 * | 2/2024 | Xu | H03K 5/134 |

OTHER PUBLICATIONS

"Written Opinion of the International Searching Authority (Form PCT/ISA/237) of PCT/CN2022/095734," mailed on May 27, 2022, pp. 1-4.

* cited by examiner

DELAY DEVICE AND DELAY CONTROL METHOD

TECHNICAL FIELD

The disclosure relates to a delay device and a delay control method, and in particular, relates to a delay device and a delay control method capable of performing dynamic adjustment without an encoder.

DESCRIPTION OF RELATED ART

With the advancement of electronic technology, the design of integrated circuits has become an important key technology. In circuit design, it is often necessary to control the transmission delay on a transmission wire. In the related art, a number of methods of adjusting the transmission delay on a transmission wire are available. For instance, delays can be generated by setting the value of a capacitor on the transmission wire or by controlling the pull-up or pull-down current source of a buffer. Regarding the above methods, the amount of delay generated may be difficult to control due to the influence of parasitic capacitance transmitted to the wire, or the adjustable range of the amount of delay is often limited and cannot meet the requirements of design specifications. In addition, in the related art, complex decoders are needed to program the amount of transmission delay provided by the transmission wire. However, through this approach, the linearity of the adjustment of the transmission delay is difficult to control, and the requirements of high-precision design specifications cannot be met.

SUMMARY

The disclosure provides a delay device and a delay control method through which generated delay may be dynamically adjusted without the need of an encoder and without being affected by parasitic capacitance.

According to an embodiment of the disclosure, a delay device includes at least one current-controlled delay group and at least one switch. The at least one current-controlled delay group is coupled to a transmission wire, each of the at least one current-controlled delay group includes at least one current-controlled delayer, and each of the at least one current-controlled delayer provides a delay according to a control voltage. The at least one switch is coupled between the at least one current-controlled delay group and the transmission wire, and each of the at least one switch is turned on or cut off according to a bit of an enable signal applied thereto.

According to an embodiment of the disclosure, a delay control method includes the following steps. At least one current-controlled delay group is disposed on a transmission wire, and each of the at least one current-controlled delay group includes at least one current-controlled delayer. A control voltage is provided to each of the at least one current-controlled delayer such that each of the at least one current-controlled delayer provides a delay. A switch is disposed between the transmission wire and each of the at least one current-controlled delay group. A corresponding bit of an enable signal is provided to each switch such that each switch is individually turned on or cut off.

BRIEF DESCRIPTION OF THE DRAWINGS

The accompanying drawings are included to provide a further understanding of the disclosure, and the accompanying drawings are incorporated in and constitute a part of this specification. The drawings illustrate the embodiments of the disclosure, and together with the description, serve to explain the principle of the disclosure.

Figure 1:
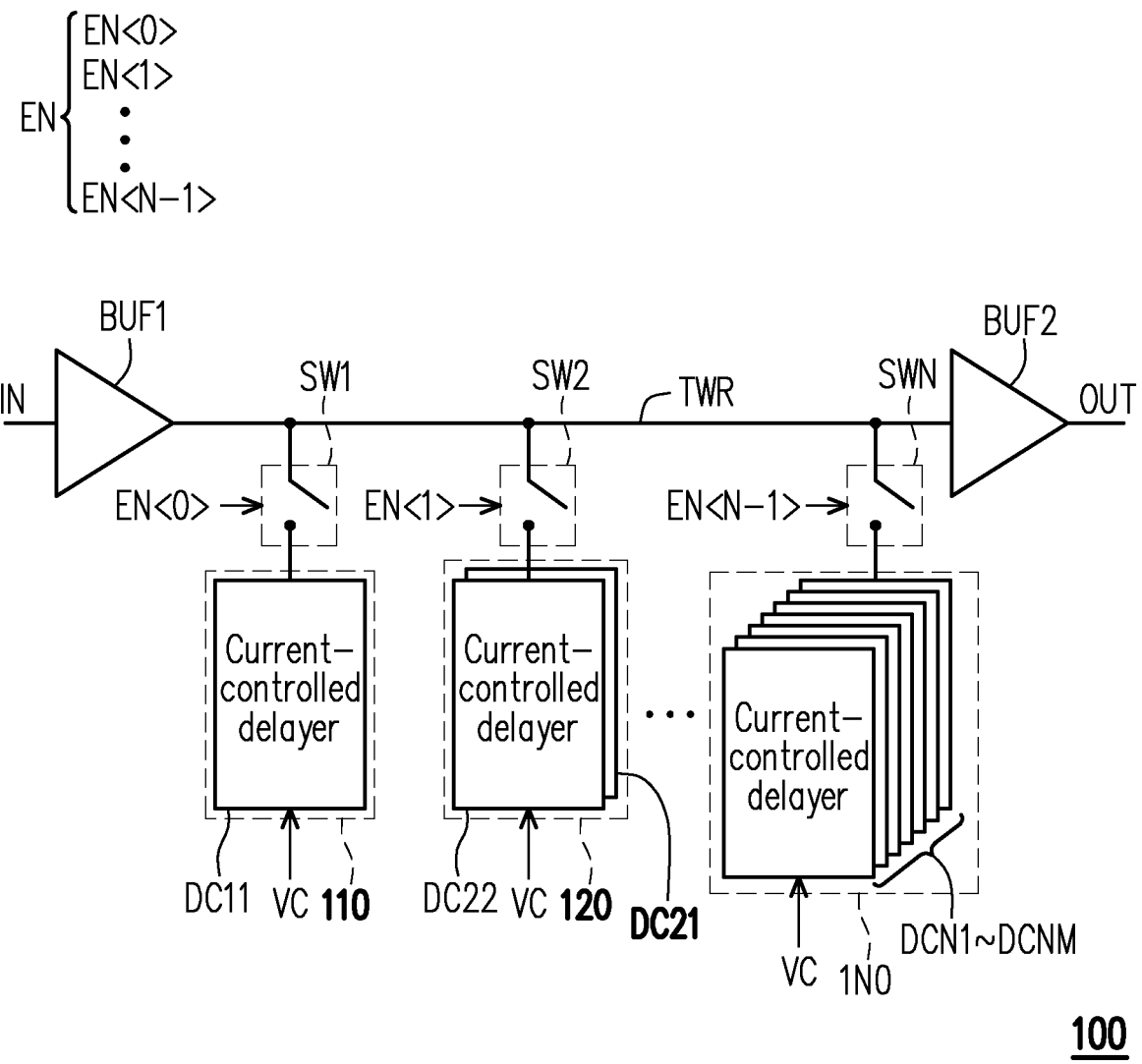
FIG. 1 is a schematic diagram of a delay device according to an embodiment of the disclosure.

DESCRIPTION OF REFERENCE NUMERALS 100, 200, 400: delay device,
110 to 1N0: current-controlled delay group,
410: enable signal generator,
420: control voltage generator,
BUF1, BUF2: buffer,
D11 to DN1: diode,
DC11 to DCNM, DC11A to DCNMB: current-controlled delayer,
EN: enable signal,
EN<0> to EN<N−1>: bit,
IN: input signal,
M11 to MN1, M31, M32, M33: transistor,
MP1, MP2, MN1, MN2: transistor,
OUT: output signal,
SW1 to SWN, SW1A to SWNB: switch,
TWR, TWR1, TWR2: transmission wire,
VC: control voltage,
VCC: power supply voltage,
VSS: reference ground terminal,
S610 to S640: control steps

DESCRIPTION OF THE EMBODIMENTS

In the following detailed description, reference is made to the accompanying drawings which form a part hereof. In the accompanying drawings, similar symbols generally denote similar components, unless context dictates otherwise.

With reference to FIG. 1, FIG. 1 is a schematic diagram of a delay device according to an embodiment of the disclosure. A delay device 100 includes a plurality of current-controlled delay group 110 to 1N0 and a plurality of switches SW1 to SWN. Herein, each of the current-controlled delay groups may include at least one current-controlled delayer. In some embodiments, the number of current-controlled delayers included in each current-controlled delay group may not be the same. For instance, as shown in FIG. 1, the first current-controlled delay group 110 includes one current-controlled delayer DC11, the second current-controlled delay group 110 includes two current-controlled delayers DC21 and DC22, and the $N^{th}$ current-controlled delay group 1N0 includes M current-controlled delayers DCN1 to DCNM, where M may be equal to $2^{N-1}$, and N is a positive integer. That is, in this embodiment, in the current-controlled delay groups 110 to 1N0, a ratio of the numbers of current-controlled delayers included in two adjacent current-controlled delay groups is 1:2. In this embodiment, a ratio of the numbers of current-controlled delayers included in the current-controlled delay groups 110 to 1N0 is 1:2:4: . . . : $2^{N-1}$ in sequence.

The switches SW1 to SWN are respectively coupled between the current-controlled delay groups 110 to 1N0 and a transmission wire TWR. In this embodiment, the transmission wire TWR may be coupled between a buffer BUF1 and a buffer BUF2. An input terminal of the buffer BUF1 receives an input signal IN, and an output terminal of the buffer BUF2 provides an output signal OUT. The switches SW1 to SWN respectively receive a plurality of bits EN<0> to EN<N−1> of an enable signal EN. Herein, the bit EN<0> may be a least significant bit (LSB) of the enable signal EN, and the bit EN<N−1> may be a most significant bit (MSB) of the enable signal EN.

In other embodiments of the disclosure, the number of current-controlled delay groups may be at least 1, and the number of correspondingly connected switches may be at least 1 as well. Further, the current-controlled delayers included in each current-controlled delay group may be one or more, and there is no specific number limit.

On the other hand, the number of current-controlled delayers in the current-controlled delay groups 110 to 1N0 may be set according to the order of the bits EN<0> to EN<N−1> of the enable signals EN received by the switches SW1 to SW. Herein, the current-controlled delay group 110 to which the switch SW1 receiving the least significant bit (bit EN<0>) of the enable signal EN is coupled only includes one (=2°) current-controlled delayer DC11, and the current-controlled delay group 110 to which the switch SW2 receiving the second least significant bit (bit EN<1>) of the enable signal EN is coupled includes two (=$2^1$) current-controlled delayers DC21 and DC22. By analogy, the current-controlled delay group 110 to which the switch SWN receiving the most significant bit (bit EN<N−1>) of the enable signal EN coupled includes M (=$2^{N-1}$) current-controlled delayers DCN1 to DCNM. That is, a bit order of the plurality of bits EN<0> to EN<N−1> of the enable signal EN is positively correlated with the number of current-controlled delayers DCN1 to DCNM in the corresponding current-controlled delay groups 110 to 1N0.

In this embodiment, each current-controlled delayer receives a control voltage VC and provides a delay according to the control voltage VC. Each current-controlled delayer may internally generate a current according to the control voltage VC and determine an amount of delay provided through the charging or discharging operation of the current. The adjustment of the amount of delay of signal transmission on the transmission wire TWR may be performed by controlling the on or off of each switch. Herein, when all the switches SW1 to SWN are respectively cut off according to the plurality of bits EN<0> to EN<N> of the enable signal EN, the amount of delay of signal transmission on the transmission wire TWR is smallest. When at least one of the switches SW1 to SWN is turned on according to the bits of the enable signal EN, the amount of delay of signal transmission on the transmission wire TWR may be increased. Therefore, the degree of improvement in the amount of delay of signal transmission on the transmission wire TWR may be determined by the number of current-controlled delayers effectively connected to the transmission wire TWR. Taking the current-controlled delayers DCN1 to DCNM providing the same delay amount X per unit as an example, when only the switch SW1 is turned on, the delay amount of the signal transmission on the transmission wire TWR may be increased by 1X, and when only the switch SW2 is turned on, the delay amount of signal transmission on the transmission wire TWR may be increased by 2X. By analogy, when only the switch SWN is turned on, the delay amount of signal transmission on the transmission wire TWR may be increased by $2^{N-1}$X. Certainly, in this embodiment, the switches SW1 to SWN may be turned on at the same time. For instance, when the switches SW1 and SW2 are both turned on, the delay amount of signal transmission on the transmission wire TWR may be increased by 3X. It can be known from the above description that when all the switches SW1 to SWN are turned on, the delay amount of signal transmission on the transmission wire TWR may be increased to a maximum value equal to ($2^{N-1}$)X.

In addition, in the embodiments of the disclosure, the delay amount of signal transmission on the transmission wire TWR may also be adjusted by adjusting the control voltage VC. Herein, by adjusting the control voltage VC, each of the current-controlled delayers DCN1 to DCNM may provide the same delay amount X' per unit. When only the switch SW1 is turned on, the delay amount of signal transmission on the transmission wire TWR may be changed to 1X'. When the switches SW1 and SW2 are both turned on, the delay amount of signal transmission on the transmission wire TWR may be increased by 3X'. It can be known from the above description that when all the switches SW1 to SWN are turned on, the delay amount of signal transmission on the transmission wire TWR may be increased to a maximum value equal to ($2^{N-1}$)X'.

It is worth mentioning that the embodiments of the disclosure, the number of bits of the enable signal EN may be set according to actual design needs, and there is no specific number of bits limited. When relatively high resolution is required for delay adjustment in the design specification, the enable signal EN may have a relatively high number of bits, such as 8 bits or 16 bits. When relatively low resolution is required for delay adjustment in the design specification, the enable signal EN may have a relatively low number of bits, such as 2 bits or 4 bits.

In addition, in this embodiment, each current-controlled delayer may have the same circuit structure and may provide the same delay.

Figure 2:
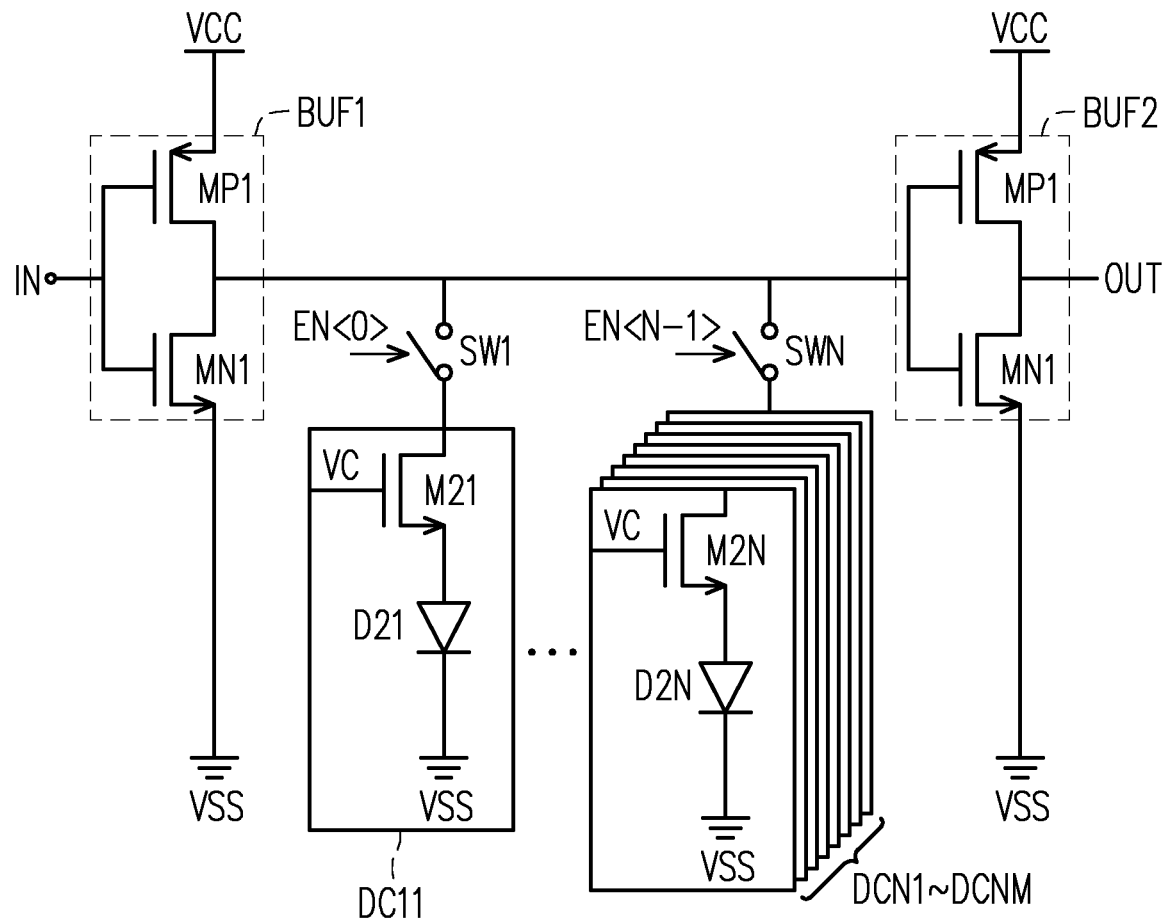
FIG. 2 is a schematic diagram of circuits of a delay device according to another embodiment of the disclosure.

With reference to FIG. 2, FIG. 2 is a schematic diagram of circuits of a delay device according to another embodiment of the disclosure. A delay device 200 includes a plurality of switches SW to SWN and a plurality of current-controlled delay groups. The current-controlled delay groups are coupled to the transmission wire TWR through the switches SW to SWN.

The transmission wire TWR is coupled between the buffers BUF1 and BUF2. The buffer BUF1 includes transistors MP1 and MN1 connected in series between a power supply voltage VCC and a reference ground terminal VSS. Control terminals of the transistors MP1 and MN1 receive the input signal IN, and coupled terminals of the transistors MP1 and MN1 are coupled to the transmission wire TWR. The buffer BUF2 includes transistors MP2 and MN2 connected in series between the power supply voltage VCC and the reference ground terminal VSS. Control terminals of the transistors MP2 and MN2 are coupled to the transmission wire TWR, and the coupled terminals of the transistors MP1 and MN1 generate the output signal OUT. The buffers BUF1 and BUF2 in this embodiment are inverters. In other embodiments, the buffers BUF1 and BUF2 may be any buffer circuits, and there is no certain limitation.

In this embodiment, the current-controlled delayers DC11 to DCNM have the same circuit structure. Taking the current-controlled delayer DC11 as an example, the current-controlled delayer DC11 includes a transistor M21 and a diode D21. The transistor M21 and the diode D21 are connected in series between the switch SW1 and the reference ground terminal VSS. A control terminal of the transistor M21 receives the control voltage VC and supplies a current according to the control voltage VC. The anode of the diode D21 is coupled to the transistor M21, and the cathode of the diode D21 is coupled to the reference ground terminal VSS. The current provided by the transistor M21 may be charged or discharged through the diode D21, and a delay is thereby generated. The current-controlled delayer DN1 includes a transistor MN1 and a diode DN1. The transistor MN1 and the diode DN1 have the same electrical characteristics as the transistor M11 and the diode D11, respectively.

The current-controlled delayers DC11 to DCNM can perform a coarse adjustment operation on the delay amount of signal transmission on the transmission wire TWR according to the control voltage VC. By turning on or off each of the switches SW1 to SWN, a fine adjustment operation of the delay amount of signal transmission on the transmission wire TWR may be performed.

Incidentally, in this embodiment, the coupling sequence of the transistor M21 and the diode D21 in the current-controlled delayer DC11 may be interchanged, which is not limited to what is shown in FIG. 2.

Figure 3A:
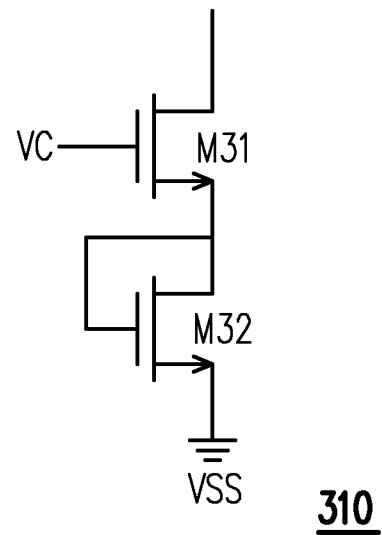
FIG. 3A and FIG. 3B each is a schematic diagram of other implementation of a current-controlled delayer in a delay device according to an embodiment of the disclosure.
Figure 3B:
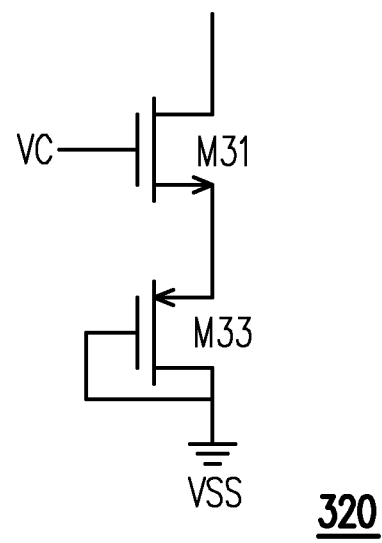

With reference to FIG. 3A and FIG. 3B, FIG. 3A and FIG. 3B each is a schematic diagram of other implementation of a current-controlled delayer in a delay device according to an embodiment of the disclosure. In FIG. 3A, a current-controlled delayer 310 includes transistors M31 and M32 connected in series with each other. The transistor M32 is an N-type transistor and is coupled in a diode configuration. A first terminal and a control terminal of the transistor M32 are coupled to each other and are coupled to the transistor M31. A second terminal of the transistor M32 is coupled to the reference ground terminal VSS. A control terminal of the transistor M31 receives the control voltage VC and generates a current according to the control voltage VC.

In FIG. 3B, a current-controlled delayer 320 includes transistors M31 and M33 connected in series with each other. The transistor M33 is a P-type transistor and is also coupled in a diode configuration. A second terminal and a control terminal of the transistor M33 are coupled to each other and are coupled to the reference ground terminal VSS. A second terminal of the transistor M32 is coupled to the transistor M31. A control terminal of the transistor M31 receives the control voltage VC and generates a current according to the control voltage VC.

Figure 4:
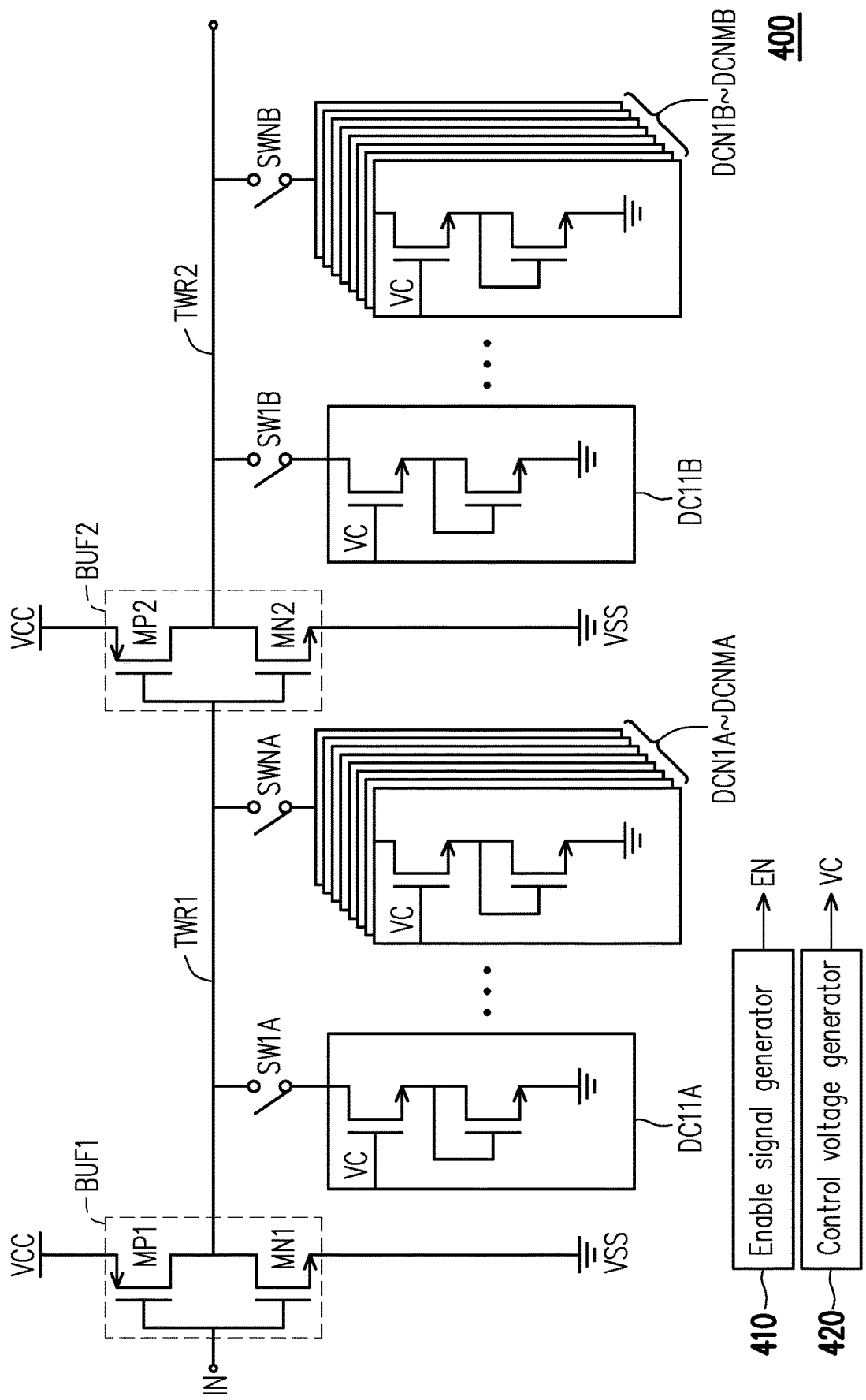
FIG. 4 is a schematic diagram of a delay device according to another embodiment of the disclosure.

With reference to FIG. 4, FIG. 4 is a schematic diagram of a delay device according to another embodiment of the disclosure. A delay device 400 includes current-controlled delayers DC11A to DCNMA and DC11B to DCNMB, switches SW1A to SWNA and SW1B to SWNB, an enable signal generator 410, and a control voltage generator 420. The current-controlled delayers DC11A to DCNMA are coupled onto a transmission wire TWR1 through the switches SW1A to SWNA, and the current-controlled delayers DC11B to DCNMB are coupled onto a transmission wire TWR2 through the switches SW1B to SWNB. The current-controlled delayers DC11A to DCNMA and the switches SW1A to SWNA are configured to adjust a signal transmission delay on the transmission wire TWR1, and the current-controlled delayers DC11B to DCNMB and the switches SW1B—SWNB are configured to adjust a signal transmission delay on the transmission wire TWR2.

The adjustment action of the signal transmission delay is described in detail in the foregoing embodiments, and description thereof is not repeated herein. Different from the previous embodiments, the enable signal generator 410 in this embodiment is coupled to the switches SW1A to SWNA and SW1B to SWNB. The enable signal generator 410 is configured to generate the enable signal EN and control the on or off of the switches SW1A to SWNA and SW1B to SWNB through the bits of the enable signal EN. In this embodiment, the enable signal generator 410 may generate the bits of the enable signal EN according to a delay fine adjustment signal, and the enable signal generator 410 may encode according to the delay fine adjustment signal to generate the bits of the enable signal EN.

The control voltage generator 420 is coupled to the current-controlled delayers DC11A to DCNMB for generating the control voltage VC. The control voltage generator 420 adjusts the control voltage VC according to a delay coarse adjustment mechanism. Herein, the control voltage generator 420 may reduce an amount of delay provided by each of the current-controlled delayers DC11A to DCNMB by increasing the control voltage VC, and the control voltage generator 420 may increase the amount of delay provided by each of the current-controlled delayers DC11A to DCNMB by lowering the control voltage VC. Taking the control voltage generator 420 to perform the delay coarse adjustment mechanism according to a digital signal to generate the control voltage VC as an example, the control voltage generator 420 may be a digital-to-analog conversion circuit.

Figure 5A:
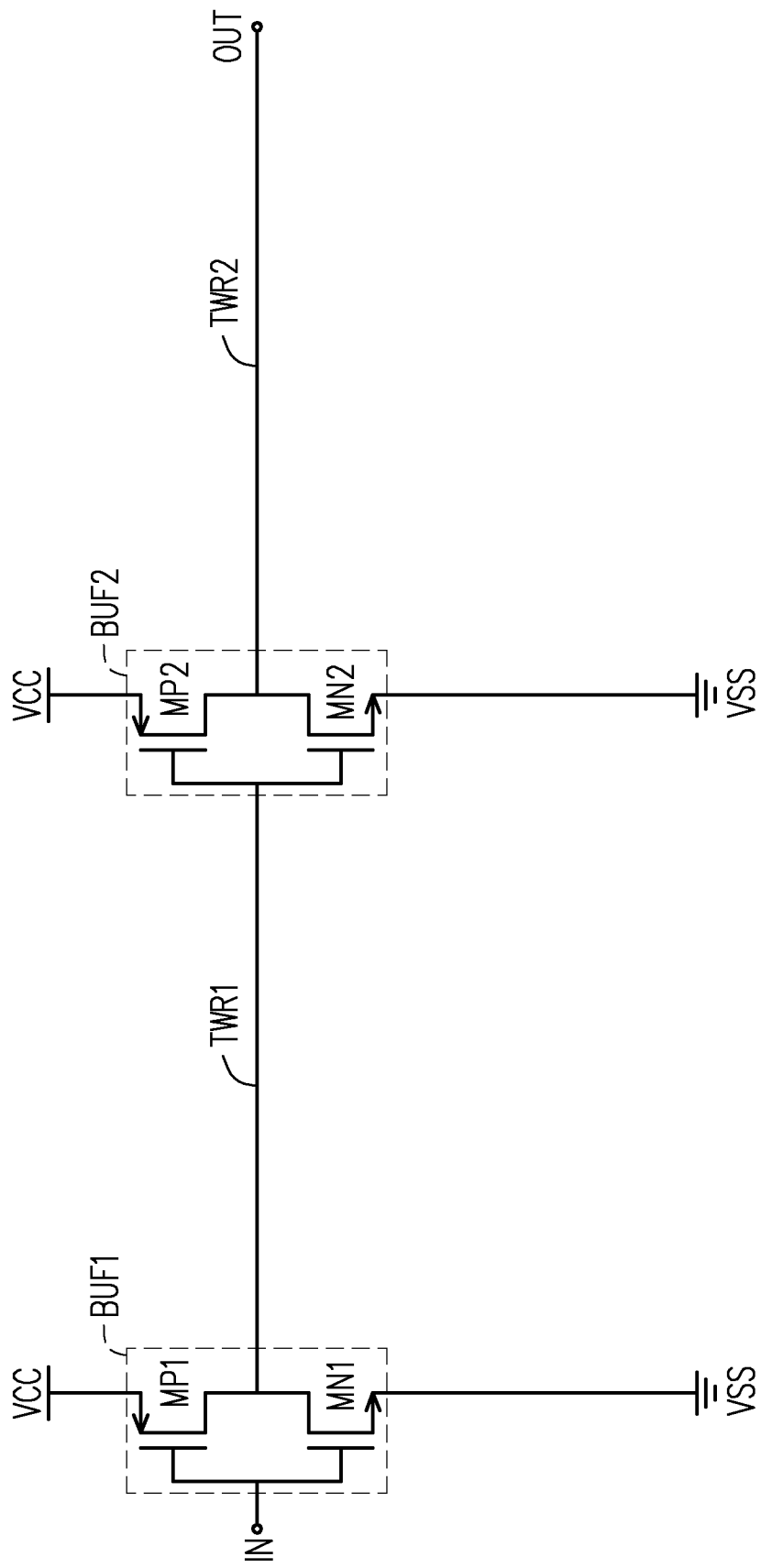
FIG. 5A and FIG. 5B are diagrams of equivalent circuits when a delay device 400 in the embodiment of FIG. 4 performs a delay adjustment operation.
Figure 5B:
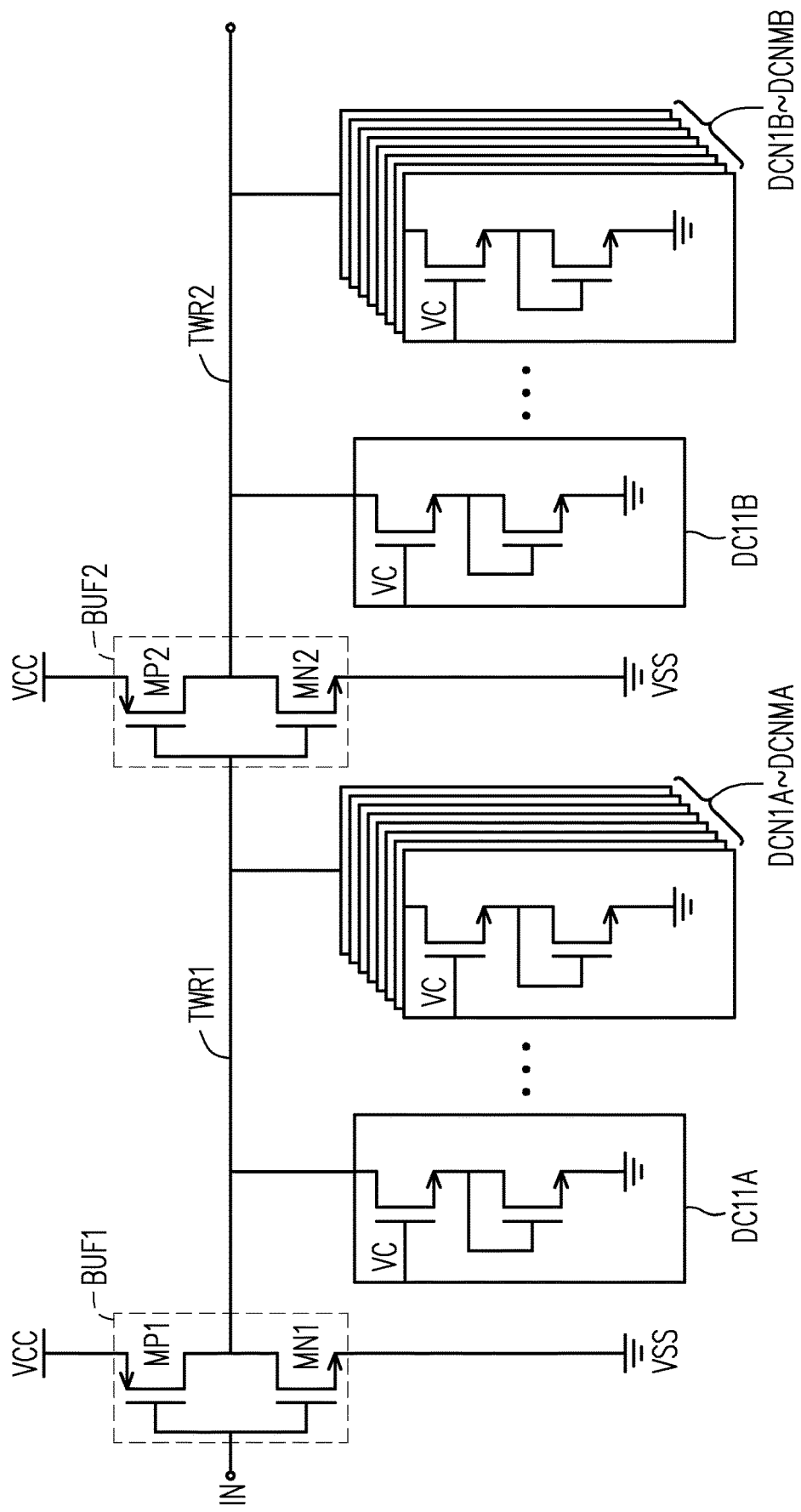

For details of the adjustment operation, reference may be made to FIG. 5A and FIG. 5B. FIG. 5A and FIG. 5B are diagrams of equivalent circuits when the delay device 400 in the embodiment of FIG. 4 performs a delay adjustment operation. In FIG. 5A, when all the switches SW1A to SWNB are turned off, all the current-controlled delayers DC11A to DCNMB are electrically isolated from the transmission wires TWR1 and TWR2. At this time, the transmission wires TWR1 and TWR2 have the smallest signal transmission delay. In FIG. 5B, when all the switches SW1A to SWNB are turned on, all the current-controlled delayers DC11A to DCNMA are electrically connected to the transmission wire TWR1, and all the current-controlled delayers DC11B to DCNMB are electrically connected to the transmission wire TWR2. At this time, the transmission wires TWR1 and TWR2 both have the maximum signal transmission delay.

Certainly, the switches SW1A to SWNB in the embodiments of the disclosure are not limited to be fully turned on or fully cut off. The delay device 400 may select the switches SW1A to SWNB to be turned on according to the required delay amount. Further, the signal transmission delay on the transmission wires TWR1 and TWR2 may be adaptively adjusted by dynamically adjusting the on/off of the switches.

Figure 6:
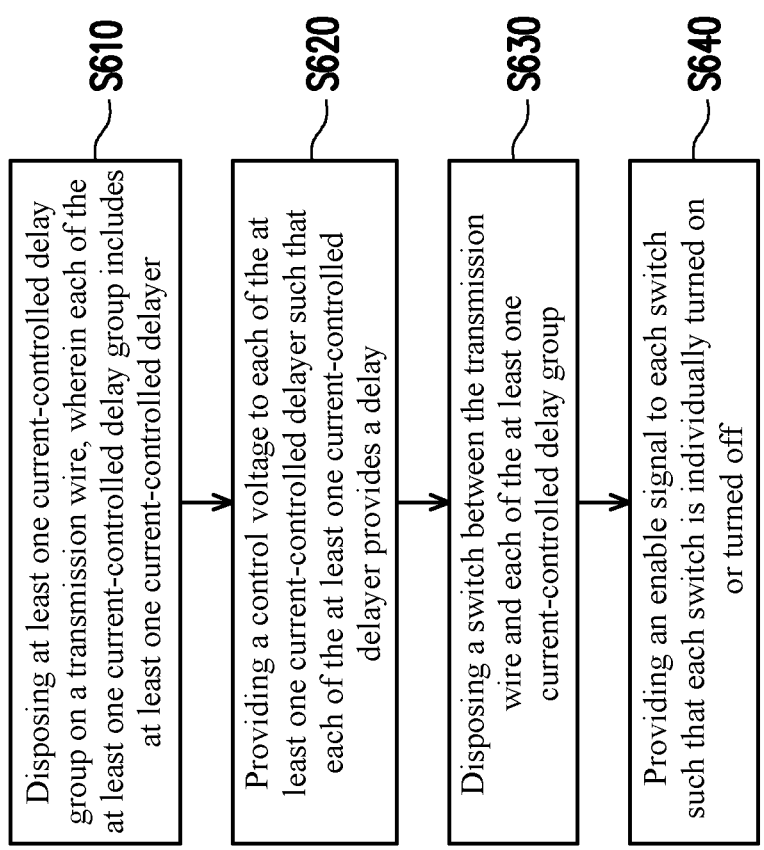
FIG. 6 is a flow chart of a delay control method according to an embodiment of the disclosure.

With reference to FIG. 6, FIG. 6 is a flow chart of a delay control method according to an embodiment of the disclosure. In step S610, at least one current-controlled delay group is set on a transmission wire. Each of the at least one current-controlled delay group includes at least one current-controlled delayer. Further, in step S620, a control voltage is provided to the at least one current-controlled delayer, such that each of the at least one current-controlled delayer provides a delay. In step S630, a switch is disposed between the transmission wire and each of the at least one current-controlled delay group. Next, in step S640, a corresponding bit of an enable signal is provided to each switch, such that each switch is individually turned on or off.

Details of the above steps are described in the foregoing embodiments, so description thereof is not repeated herein.

According to the above, in the embodiments of the disclosure, at least one current-controlled delay group is disposed on the transmission wire, and each of the at least one current-controlled delay group has one or a plurality of current-controlled delayers. Further, one switch is disposed between each of the at least one current-controlled delay group and the transmission wire. By controlling the on or off of each switch, the number of current-controlled delayers actually connected onto the transmission wire may be controlled, and the amount of transmission delay of the transmission wire may be effectively controlled. Through the arrangement of the at least one current-controlled delay group, a digital delay programming operation may be achieved without arranging a complex decoder in the delay device provided by the embodiments of the disclosure. Further, both coarse adjustment (adjusting the control voltage) and fine adjustment (adjusting the on or off of the switch) are provided in the disclosure to adjust the delay amount, so that the adjustment range and resolution may both be expanded. Besides, the linearity of the adjustment of delay amount may also be effectively improved. The current-controlled delayer provided by the disclosure may also be used to reduce the image caused by parasitic capacitance by means of current control.

Finally, it is worth noting that the foregoing embodiments are merely described to illustrate the technical means of the disclosure and should not be construed as limitations of the disclosure. Even though the foregoing embodiments are referenced to provide detailed description of the disclosure, people having ordinary skill in the art should understand that various modifications and variations can be made to the technical means in the disclosed embodiments, or equivalent replacements may be made for part or all of the technical features; nevertheless, it is intended that the modifications, variations, and replacements shall not make the nature of the technical means to depart from the scope of the technical means of the embodiments of the disclosure.

What is claimed is:

1. A delay device, comprising:
    a plurality of current-controlled delay groups, coupled to a transmission wire, wherein a first current-controlled delay group comprises one first current-controlled delayer, at least one second current-controlled delay group comprises a plurality of second current-controlled delayers and each of the first current-controlled delayer and the plurality of second current-controlled delayers provides a delay according to a control voltage;
    a plurality of switches, wherein each of the plurality of switches is coupled between the each of the plurality of current-controlled delay groups and the transmission wire, wherein each of the plurality of switches is turned on or off according to a bit of an enable signal applied thereto
    wherein the plurality of current-controlled delay groups respectively correspond to the plurality of switches, and number of the plurality of switches is equal to number of the plurality of current-controlled delay groups.

2. The delay device according to claim 1, wherein each of the first current-controlled delayer and the plurality of second current-controlled delayers comprises:
    a first transistor, supplying a current according to the control voltage; and
    a delay unit, coupled in series with the first transistor between the transmission wire and a reference ground terminal and performing charging or discharging operation according to the current to provide the delay.

3. The delay device according to claim 2, wherein the delay unit is a diode.

4. The delay device according to claim 2, wherein the delay unit is a second transistor, a first terminal of the second transistor is coupled to the first transistor, a control terminal of the second transistor is coupled to the first terminal of the second transistor, a second terminal of the second transistor is coupled to the reference ground terminal, and the second transistor is an N-type transistor.

5. The delay device according to claim 2, wherein the delay unit is a second transistor, a first terminal of the second transistor is coupled to the first transistor, a control terminal of the second transistor is coupled to a second terminal of the second transistor, the second terminal of the second transistor is coupled to the reference ground terminal, and the second transistor is a P-type transistor.

6. The delay device according to claim 1, wherein a ratio of numbers of current-controlled delayers included in two adjacent current-controlled delay groups is 1:2.

7. The delay device according to claim 1, wherein each bit of the enable signal correspondingly controls one switch to be turned on or off.

8. The delay device according to claim 7, wherein the bit order of each bit of the enable signal is positively correlated with a number of the at least one current-controlled delayer of the corresponding current-controlled delay group.

9. The delay device according to claim 1, further comprising:
    an enable signal generator, coupled to each of the at least one switch and configured to generate the enable signal to control each of the at least one switch individually according to a delay fine adjustment signal.

10. The delay device according to claim 1, further comprising:
    a control voltage generator, coupled to the plurality of current-controlled delay groups and configured to generate the control voltage and adjust the control voltage according to a delay coarse adjustment mechanism.

11. A delay control method, comprising:
    disposing a plurality of current-controlled delay groups on a transmission wire, wherein a first current-controlled delay group comprises one first current-controlled delayer and at least one second current-controlled delay group comprises a plurality of second current-controlled delayers;
    providing a control voltage to each of the first current-controlled delayer and the plurality of second current-controlled delayers such that each of the first current-controlled delayer and the plurality of second current-controlled delayers provides a delay;
    providing a plurality of switches and disposing each of the plurality of switches between the transmission wire and each of the plurality of current-controlled delay groups, wherein the plurality of current-controlled delay groups respectively correspond to the plurality of switches, and number of the plurality of switches is equal to number of the plurality of current-controlled delay groups; and
    providing a corresponding bit of an enable signal to each switch such that each switch is individually turned on or off.

12. The delay control method according to claim 11, further comprising:
    setting a first transistor in each of the first current-controlled delayer and the plurality of current-controlled delayers, such that the first transistor provides a current according to the control voltage; and setting the current to perform charging or discharging on a delay unit to provide the delay.

13. The delay control method according to claim 11, further comprising:

setting a ratio of the numbers of current-controlled delayers included in two adjacent current-controlled delay groups to be 1:2.

14. The delay control method according to claim 11, further comprising:

allowing each bit of the enable signal to correspondingly control turned on or off status of one switch.

15. The delay control method according to claim 14, wherein: a bit order of each bit of the enable signal is positively correlated with the number of the at least one current-controlled delayer of the corresponding at least one current-controlled delay group.

16. The delay control method according to claim 11, further comprising:

generating the enable signal according to a delay fine adjustment signal; and adjusting the control voltage according to a delay coarse adjustment mechanism.

\* \* \* \* \*